US012283902B2

(12) United States Patent
Grulke

(10) Patent No.: US 12,283,902 B2
(45) Date of Patent: Apr. 22, 2025

(54) PIEZO THERMAL ELECTRIC DEVICE TO HARVEST ENERGY FOR RAIL BASED TRANSPORTATION

(71) Applicant: Bruce Nixon Grulke, Chesapeake, VA (US)

(72) Inventor: Bruce Nixon Grulke, Chesapeake, VA (US)

( * ) Notice: Subject to any disclaimer, the term of this patent is extended or adjusted under 35 U.S.C. 154(b) by 820 days.

(21) Appl. No.: 17/456,435

(22) Filed: Nov. 24, 2021

(65) Prior Publication Data
US 2022/0166350 A1    May 26, 2022

Related U.S. Application Data

(60) Provisional application No. 63/117,800, filed on Nov. 24, 2020.

(51) Int. Cl.
*H02N 2/18*     (2006.01)
*F03G 7/08*     (2006.01)
*H10N 30/30*    (2023.01)

(52) U.S. Cl.
CPC .............. *H02N 2/18* (2013.01); *F03G 7/083* (2021.08); *H10N 30/304* (2023.02)

(58) Field of Classification Search
CPC ........ H02N 2/18; H02N 30/304; H02N 30/30; F03G 7/083
See application file for complete search history.

(56) References Cited

U.S. PATENT DOCUMENTS

| | | | |
|---|---|---|---|
| 7,812,508 B2 * | 10/2010 | Abramovich | H02N 2/18 310/339 |
| 11,637,488 B2 * | 4/2023 | Kim | H02K 35/02 701/31.4 |

FOREIGN PATENT DOCUMENTS

CN    102084062 A  *  6/2011  ............. E01B 26/00

OTHER PUBLICATIONS

CN-102084062 in English (Year: 2011).*

* cited by examiner

*Primary Examiner* — Emily P Pham
(74) *Attorney, Agent, or Firm* — Dunlap Bennett & Ludwig, PLLC

(57) ABSTRACT

A piezo electric and thermal harvesting method for rail-transportation systems. The method embodies a three-dimensional arrangement of piezo vertebrae configured in parallel within a track housing that is operatively associated with the rail of the rail-transportation system. Weight from rail traffic compresses the track housing and thus the piezo vertebrae, thereby generating electricity. Thermal control incorporates a chill beam within the track housing as well as a multi-wire thermal electric couple wiring scheme.

6 Claims, 6 Drawing Sheets

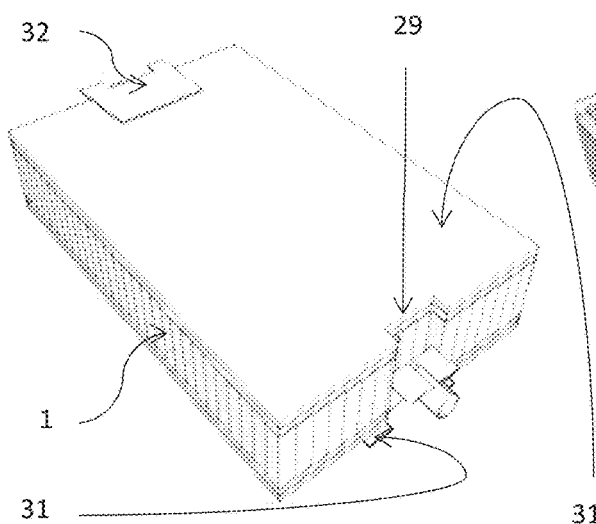
FIG. 4C
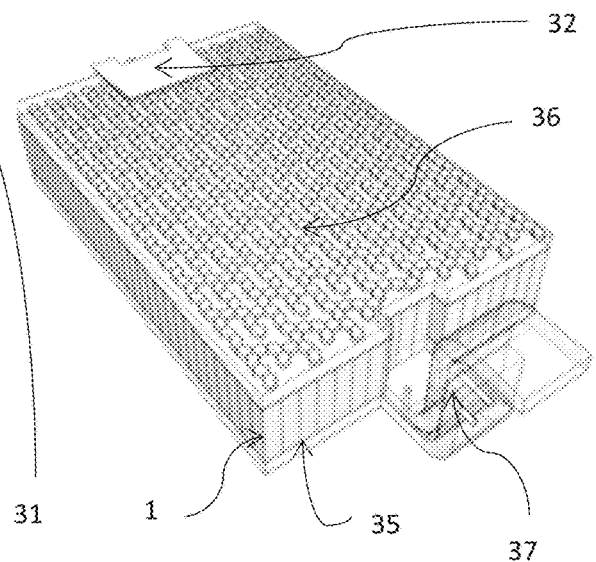
FIG. 4D
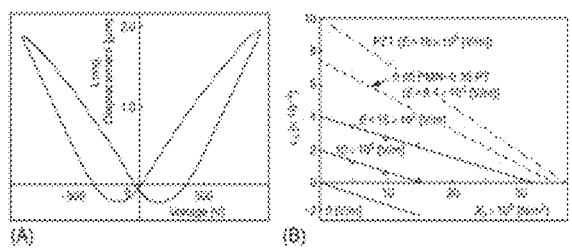
FIG. 4E
FIG. 4F

PIEZO THERMAL ELECTRIC DEVICE TO HARVEST ENERGY FOR RAIL BASED TRANSPORTATION

CROSS-REFERENCE TO RELATED APPLICATION

This application claims the benefit of priority of U.S. provisional application No. 63/117,800, filed 24 Nov. 2020, the contents of which are herein incorporated by reference.

BACKGROUND OF THE INVENTION

The present invention relates to power systems for rail-based transportation and, more particularly, to a piezo thermal electric system to harvest energy for rail-based transportation.

Piezoelectric materials convert force into renewable energy; specifically, piezoelectric materials generate an electric charge when subjected to mechanical stress. Inversely, piezoelectric materials change dimensions when an electric field is applied across the material. These are known respectively as the direct piezoelectric effect and the inverse piezoelectric effect, referred to de-poling and re-poling, respectively, hereinafter.

Piezoelectric materials have, however, been marginalized because of their high voltage, low current, high impedance, and relatively low power output. A further drawback to current piezoelectric technologies in the rail-based transportation field is how the piezoelectric effect is negatively affected by heat and humidity and even disappears if the material exceeds the Curie temperature or Curie point.

As a result of this unsolved problem, currently most piezoelectric materials are sub-optimally used to harvest energy in rail transportation application; specifically, the piezoelectric materials aim to harvest electrical energy from pressure changes, vibrations, and mechanical impulses, not through the linear application of the compressive stress from the weight of the cars rolling along the track. For instance, one rail transport system incorporates piezoelectric elements embedded in the systemic rubber rail pad, thereby design shielding the piezoelectric elements from the full compression load to avoid failure/fracture of the elements thereunder. Furthermore, the rubber in this solution prevents excess heat from escaping to an extent that the trapped heat diminishes the piezoelectric effect. As a result of these limitations, these rubber rail pads have been deemed safe for 15-20 railcars; unfortunately, the typical length of a freight train is 100 cars, and once the temperature on the piezo elements exceeds its Curie temperature it loses all piezo properties.

The lack of a piezo-based energy harvesting system of rail transportation is unlucky because recent developments in the automotive industries has produced piezo technologies producing outputs at 800V.

Accordingly, there is a need for a piezo thermal electric system to harvest energy for rail-based transportation. The piezo thermal electric system of the present invention includes a plurality of piezo thermal electric track housings operatively associated with the rails/track of the transportation system so that the weight of the cars rolling along the track produces the direct piezoelectric effect.

Each track housing contains a plurality of stacks of piezo thermal electric cassettes (or "vertebrae") stacked in a parallel configuration. Each piezo thermal electric vertebrae encases a mass of piezoelectric material along with a compression disc. For each track housing, when the operatively associated rail compresses under the load of a vehicle, the track housing experiences compression stress, which in turn is exerted on the individual vertebrae. This mechanical stress de-poles the piezoelectric material therein, resulting in the discharge of electricity for use by the piezo thermal electric system.

The mechanical structure of each vertebra assures proper transfer of compressive loads to the mass of piezoelectric material. The mechanical structure of each vertebra also keeps the piezoelectric material safely sealed from humidity. The vertebra may be steel with an epoxy coated to seal the pores in the steel, thereby preventing electrical conduction through to the exterior of the vertebra except for a dedicated electrical connection through which the discharged electricity controllably flows. The seal also facilitates thermal conduction for transferring heat resulting from the mechanical stress to and mechanical deformation of the piezoelectric mass and the steel vertebra. The heat transfers around the perimeter of the steel vertebra, as the piezoelectric material de-poles, is absorbed on the interior by the chill beam as the piezoelectric material re-pole by running current through a thermal electric pair. The connection with the copper conductor occurs in an internal baffle for the vent so that as it creates heat, the heat will exhaust to the outside air.

The present invention also contemplates stacking the piezo vertebra on top of one another enabling the separated piezoelectric slabs/masses to function in parallel, thereby improving current and power output without increasing the voltage.

In short, the present invention arranges a plurality of stacks of piezoelectric masses, each piezoelectric mass housed in a separate vertebra, wherein each vertebra is carefully designed to deliver uniform loading to the piezoelectric mass without exceeding its structural capacity, while this stacked arrangement stacked reduces hazard from thermal and moisture conditions through other systemic components disclosed more in full below.

SUMMARY OF THE INVENTION

In one aspect of the present invention, a power generating system for a rail transport application, the system includes the following: a plurality of piezo vertebrae configured in parallel and housed in a track housing; and the track housing having a cover operatively associated a rail of the rail transportation system in such a way that when a rail vehicle of the rail transport application rides the rail the cover is urged against the plurality of piezo vertebrae, whereby electricity is generated.

In another aspect of the present invention, the power generating system for a rail transport application wherein the plurality of piezo vertebrae is arranged in a plurality of stacks comprising two columns of stacks and one or more rows; and an upper compression plate spanning the plurality of stacks; a chill beam disposed between the two columns of stacks, wherein each piezo vertebra enables vertical movement from axial compression without compromising the integrity of the enclosure around the piezo electric material, wherein the rail transportation provides a positive brush and a negative brush, and wherein each brush is electrically connected to each piezo vertebra for de-poling and re-poling a piezoelectric mass therein, and wherein each piezo vertebra enables vertical movement from axial compression without plastically compromising a vertical height of the piezo vertebra.

These and other features, aspects and advantages of the present invention will become better understood with reference to the following drawings, description and claims.

BRIEF DESCRIPTION OF THE DRAWINGS

FIG. 4C is a perspective view of a nickel/copper connection of an exemplary embodiment of the present invention.

FIG. 4D is a perspective view of a copper sintered graphene connection of an exemplary embodiment of the present invention.

FIG. 4E is a diagrammatic view of a de-poling and re-poling diagram of an exemplary embodiment of the present invention.

FIG. 4F is a chart of properties of piezo electric materials.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

LIST OF COMPONENTS

1 Piezo Slab.
2 Epoxy Coated Steel/Ceramic Alumina, Vertebra.
3 Teflon/Epoxy/Ceramic Alumina/ Epoxy Coated Steel Compression Disc.
4 Nickel Connector.
5 Copper Through Housing Insert.
6 Elastomeric Isolation Coating/Washer.
7 Nickel Bus Bar.
8 Copper/Aluminum/Nickel Insert.
9 Copper/Aluminum/Nickel Cable Conductor to Overhead/Crosstie.
10 Carbon Chill Beam with Copper/Nickel Housing Inserts.
11 Epoxy Coated Steel Bearing Plate Between Crossties.
12 Elastomeric Rail Bearing Pad.
13 Steel Rail Plate.
14 Elastomeric Rail Clamp.
15 Threaded Inserts Embedded in Precast Concrete.
16 ASTM 325 bolts or suitable fasteners.
17 Existing Precast Concrete Tie.
18 Precast Hollow Core Concrete Tie.
19 Wiring Conduit in Hollow Core Tie.
20 Precast Concrete Rail Transition.
21 Precast Concrete Housing Enclosure.
22 Embedded Steel Welding Plate with Nelson Bolts.
23 Epoxy Coated Steel Track Housing.
24 Epoxy Coated Steel Housing Cover.
25 De-pole Under Carriage Carbon Brush (+).
26 Re-pole Under Carriage Carbon Brush (−).
27 Top Compression Disc.
28 Vent.
29 Alignment Notch in Vertebra.
30 Alignment Notch in Compression Disc.
31 Nickel Coated Wire.
32 Upper Compression Disc.
33 Stackable Piezo Vertebrae.
34 Base Bearing Disc.

Referring the FIGS. 1 through 4F, the present invention may include an energy harvesting system for rail-based transportation. The energy harvesting system includes piezoelectric media embodied in spaced apart piezo slabs 1. The piezoelectric media may comprise piezoelectric material, including but not limited to high-temperature, soft, lead-free, piezoelectric ceramic material, or any piezoelectric material adapted to convert mechanical energy of compression and tension into electrical energy. Individual piezoelectric slabs 1 are operatively associated with an inner compression disc 3 and encased in a systemic vertebra 2.

Figure 3:
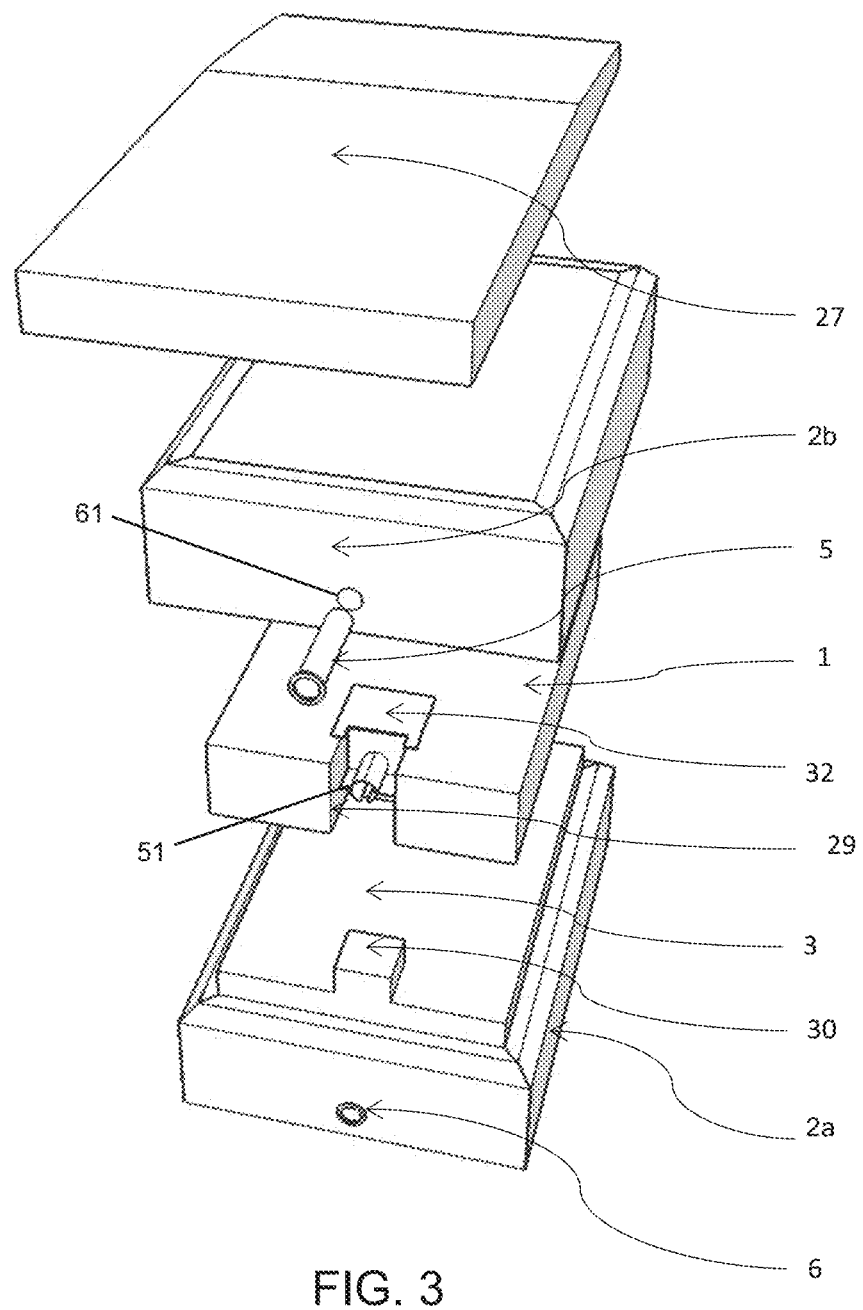
FIG. 3 is a perspective view of a vertebra assembly of an exemplary embodiment of the present invention.

In each vertebra 2, the piezo slab 1 engages an inner compression disc 3, as illustrated in FIG. 3. The piezo slab 1 and the inner compression disc 3 are encased in a lower housing portion 2a and an upper housing portion 2b of the vertebra 2. The width and length of the piezo slab determines the surface area that is in compression with the physical properties of the piezo electric material determining the energy output. Since in some cases, the device must fit in between consecutive railroad ties the length of the piezo slab was established at 1.75" to allow for two rows of vertebrae, the chill beam and room for wiring within the steel track housing. The width of the piezo slabs was established at 1" so that the two arrays, when combined with the thickness of the vertebrae themselves and internal clearances, would allow the steel cover plate to transfer the load form the rail evenly without excessive deflection that would keep the loading on the piezo slabs uniform, and within the plastic range of the material. Initially based on using lead based piezoelectric material, the thickness of the piezo slab was selected slab was set at $3/16$" with an anticipation of $1/16$" of deflection. That meant that the inner compression discs needed to be $3/16$" thick as well so that they could accommodate the deflection as the piezo slab de-poled and still have adequate length to maintain contact with the inner walls of the vertebrae stacked above. In this way, the piezo electric material has minimal exposure to air or moisture within the steel housing. The wall thickness of the steel of the vertebra surrounding the piezo slab was established at $1/8$" so that the sum total of all of the steel material in the vertebrae would limit any excessive load, say from the wheels of a locomotive overhead. The top edge of the vertebrae and the underneath edge at the bottom are chamfered to gradually accept the load and accommodate any horizontal movement in the stacks of vertebrae.

An alignment node 29 on the inner compression disc 3 and complementary alignment notch 30 associated with the piezo slab 1 may be dimensioned and adapted to align and form a secure engagement to assure proper positioning as the piezo slab 1 changes geometry under compression and de-poling. Relative to each of the components, the thickness of the piezo slabs change as the load passes over the top so there needs to be tolerance between the alignment node and the alignment notch 30 for this movement to occur as the material de-poles.

Furthermore, the alignment notches 30 may afford space for a slab pin 51 protruding from the piezo slab 1. The slab pin 51 is an electrically conductive material through which electricity generated by de-poling of the piezo slab 1 flows. The lower housing portion 2*a* and an upper housing portion 2*b* may provide complementary vertebra through-holes 61 aligned with the slab pin 51 when the vertebra is in an encased condition. One or both the vertebra through-holes 61 may provide an elastomeric isolation coating/washer 6 for dealing with deformation of the vertebra 2 and the slab 1 during de-poling and re-poling. The aligned vertebra through-holes 61 and slab pin 51 may be electrically connected to the exterior of the vertebra 2 by way of an electrical insert 5 or conduit. The electrical insert 5 may be made from silver, palladium, nickel, copper, a combination thereof, or an equivalent material.

The through-housing insert 5 may be held in position through the engagement of the alignment nodes 29 and the alignment notch 30. The elastomeric isolation coating/washer 6 between the inset 5 and the piezo slab 1 isolates the piezo slab 1 from the exposure to the environmental conditions inside the epoxy coated steel track housing 23. The epoxy coating should not conduct electricity from the through housing insert 5 but the coating may become worn after the billion strikes that the piezo electric material can take. An elastomeric isolation coating or washer can provide better isolation as the number of strikes increase. This coating also reduces any internal stress on the connectors inside the vertebrae. The incoming wiring can be aligned with the of the piezo electric slab 1 as there is no deformation at the top surface of the slab 1. The wiring—through housing insert—on the outgoing side may be positioned in the center of the slab 1 to cut the movement in half. The connectors are designed to flex but the elastomeric washer/coating reduces the movement. When the slabs re-pole, the alignment nodes 29 need to be sized and adapted so that they are still have ample connection with the notches to bring the vertebra 2 back into their resting position. The compression discs 3 may be Teflon/epoxy/ceramic alumina or equivalent material that is dimensioned and adapted to accommodate the change in dimension of the piezoelectric material of the piezo slab 1 under loading contemplate herein.

Each systemic vertebra 2 may be epoxy-coated steel or equivalent. The epoxy coating should be electrically non-conduct electricity and thermal conductive. The epoxy coating may be the equivalent of "electrical potting compound" or the like.

The energy harvesting system embodied in the present invention further contemplates a plurality of vertebrae being arranged in a vertical stack, and a plurality of these stacks arranged in a horizontal matrix, resulting in a three-dimensional (3D) configuration of vertebra. The 3D configuration may be housed in a track housing 23. The track housing 23 may be made of a thermally and electrically conductive material, such as but not limited to steel. The track housing 23 may be epoxy coated, like the individual vertebrae.

Figure 4A:
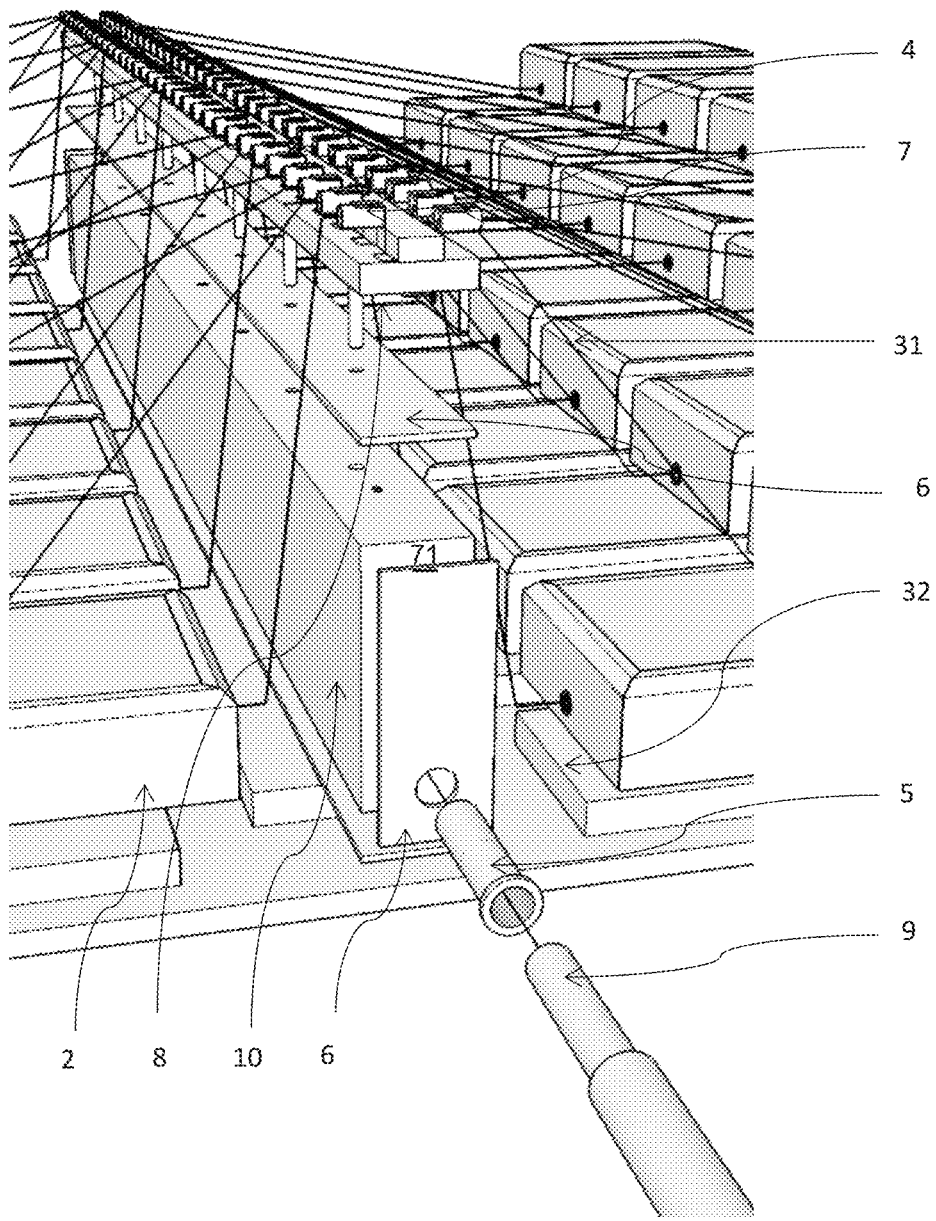
FIG. 4A is a perspective view of a wiring diagram of an exemplary embodiment of the present invention, showing an embodiment using silver, palladium, and/or nickel coated wires 31 electrically connected each vertebra of a track housing 23 to the bus bar 7.

Referring the FIG. 4A, in certain embodiments, each track housing 23 may have a two-by-two matrix of vertical stacks, wherein the two columns of stacks are separated by a carbon chill beam 10. In other words, the chill beam 10 extends longitudinally and centrally along the enclosure of the track housing 23. As a result, there is a continuous row of vertebrae stacks on each side of the chill beam 10. In such an arrangement, the vertebra through-holes 61 may be electrically connected (by way of the insert 5) to a connector 4 operatively associated with a bus bar 7 connected to (along an upper surface of) the chill beam 10, by way of an elastomeric isolation plate 6 and a bus insert 8. The bus insert 8 may be made of copper, aluminum, nickel, a combination thereof, or equivalent materials. Along a latitudinal face 71 of the chill beam 10 may provide electrical connection (not shown) for receiving an electrical insert 5 residing within the extent of the chill beam 10.

Figure 4B:
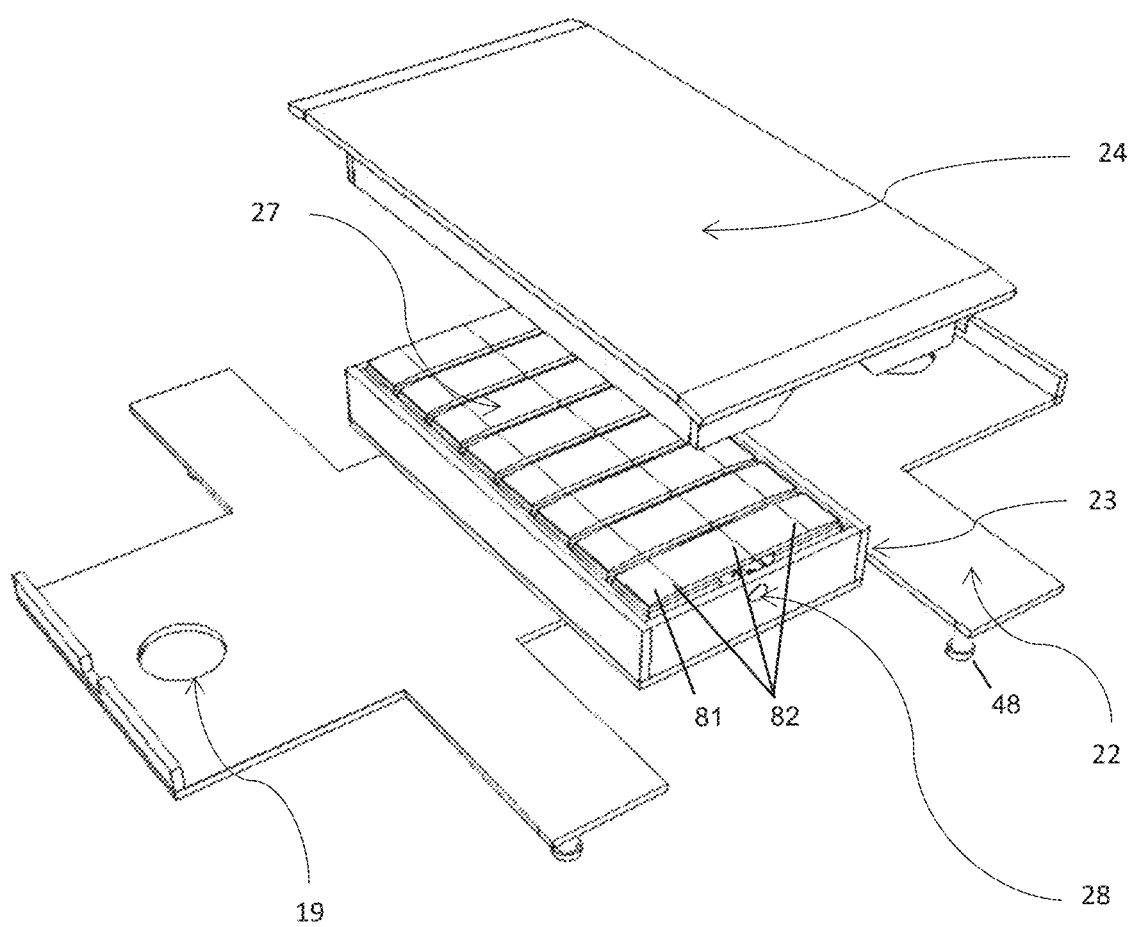
FIG. 4B is a perspective view of an assembled energy harvester component of an exemplary embodiment of the present invention.

Referring to FIG. 4B, each pair of adjacent column stacks, i.e., the two stacks separated by the carbon chill beam 10, may have one, shared upper compression disc 27 extending over the two stacks. The compressions disc 27 is sized to accommodate full range of movement including where the top of one vertebra 2 bears on the bottom of the one below. The compressions disc 27 may provide a chamfer 81 around the upper corners of the vertebrae that can accommodate vertical loads that may be less than axial with respect to the piezo vertebrae 2, prevent the horizontal movement of vertebrae 12, and as a corollary assure that the mechanical stress on the piezo slab 1 does not exceed its capacity. The chamfer 81 and related curvature may be defined by the lines of delineation 82, illustrated in FIG. 4B. A housing cover 24 may close off the track housing 23.

Figure 1:
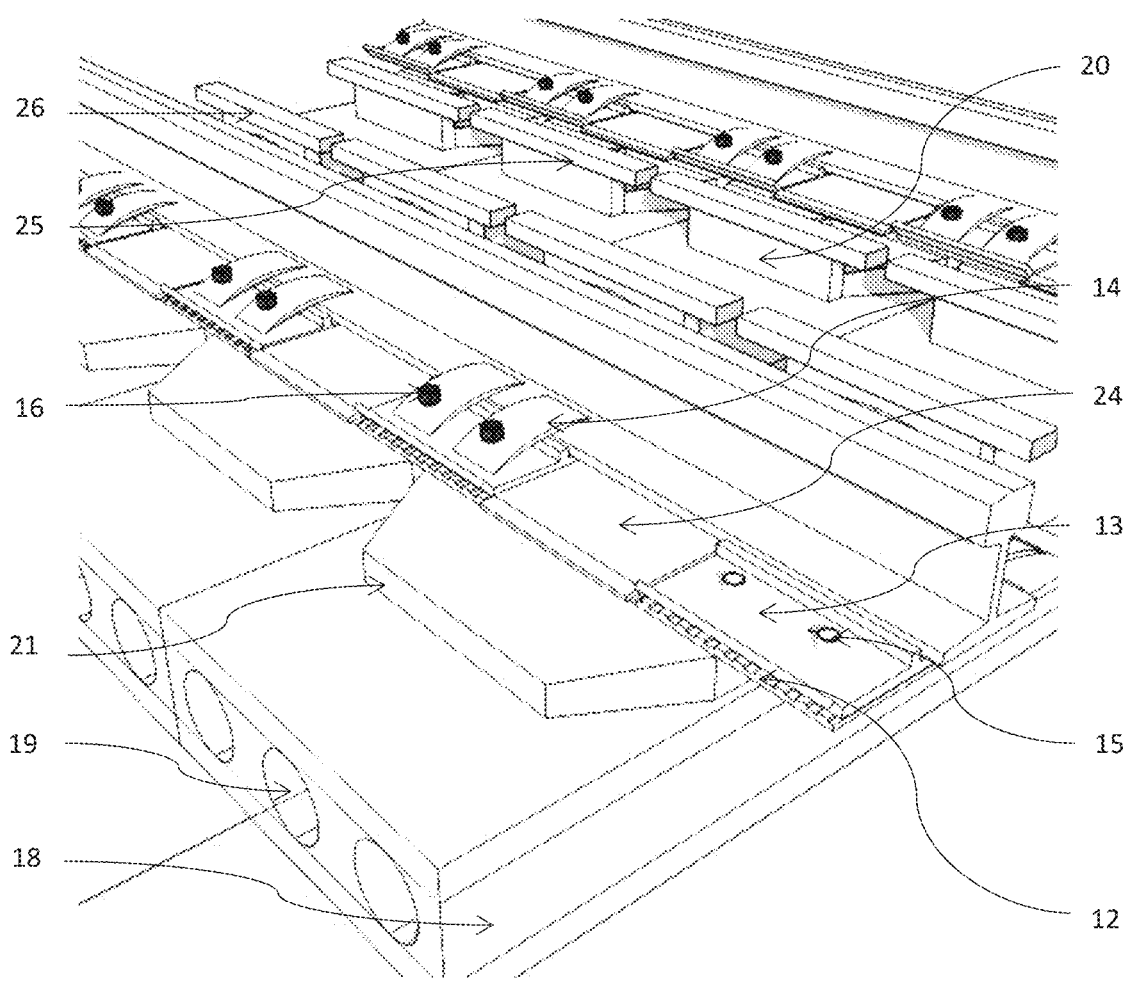
FIG. 1 is a perspective view of a new precast concrete tie of an exemplary embodiment of the present invention.
Figure 2A:
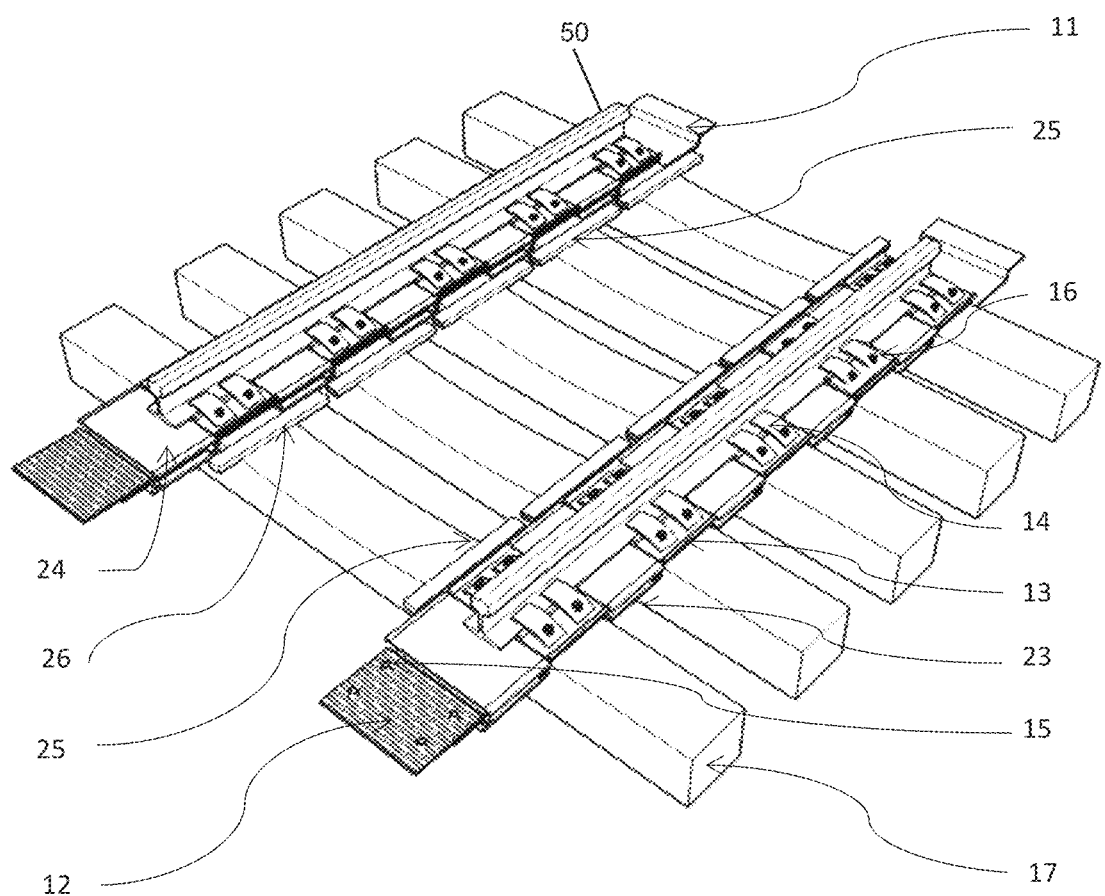
FIG. 2A is a perspective view of a configuration of an existing precast concrete tie of an exemplary embodiment of the present invention.
Figure 2B:
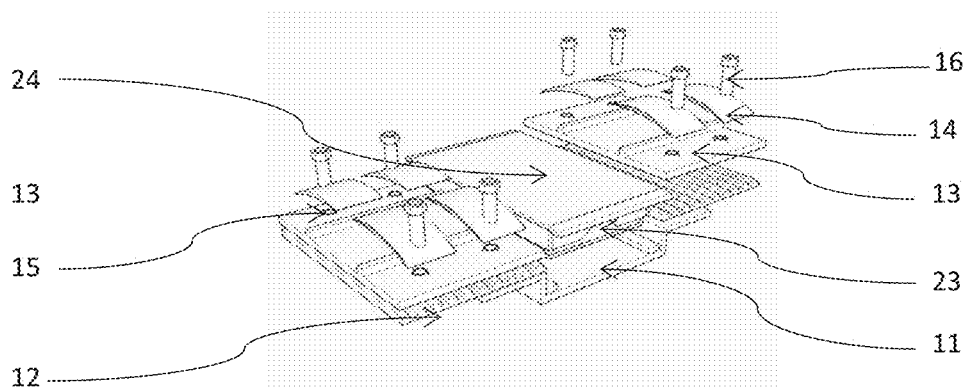
FIG. 2B is a perspective view of a sub-assembly for the existing precast concrete tie configuration of FIG. 2A.

Referring to FIGS. 2A and 2B, during use, the track housing 23 may be disposed adjacent the track/rail 50 and on an elastomeric bearing pad 12. The track housing 23 may be disposed so that the compressive stresses from the weight of the vehicle using the rail 50 urges down on the housing cover 24. There may be a base compression disc attached to the bottom surface of the track housing 23 to position the upper compression disc 27 to transfer this compressive load from the steel housing cover 24 to the stacked vertebrae 2. Since the elastomeric bearing rail bearing pads 12 deflect as the loads passes over them the top compression disc is curved (chamfered 81) so that the stacks of vertebrae 2 are not moved out of position.

The present invention is configurable to be used in new construction (see FIG. 1) and retrofitting to pre-existing construction (see FIGS. 2A and 2B). In new construction, elastomeric rail clamps 14 and rail plates 13 may secure the rails 50 to precast concrete ties 17 and 18 by way of fasteners 15 and 16, such as threaded inserts 15 and ASTM 325 bolts or the like. In some embodiments, the fasteners 16 secure the rail with elastomeric rail clamp(s) 14 and passthrough holes in the steel rail plates 13, elastomeric rail pads 12 and epoxy coated steel bearing pad 12 into threaded inserts 15 embedded in precast concrete 17.

The track housings 23 may be spaced apart between the rail clamps 15 and rail plates 13 so that the rail 50 bears on the housing cover 24. Underneath the track housings 23 may be precast concrete rail transitions 20 and/or precast concrete housing enclosures 21, which connect to the precast concrete ties 17 and 18. The hollow precast concrete ties 18 have hollow cores 19 to enable electrical wiring to pass through for controlling the power generated by the energy harvesting system. Referring to FIG. 4B, the track housing 23 may engage an embedded welding plate with bolts 48 for being cast in the wet cement.

In the context of retrofitting, a sub-assembly may include an interface bearing plate 11 between crossties, wherein the track housing 23 is seated in the interface bearing plate's recessed portion. The interface bearing plate 11 may enable rail flanges to bear on the housing cover 24 for transferring the compressive load to the vertebrae 2 of that track housing 23. The track housing 23 is positioned between precast concrete tie(s) 17 on the epoxy coated steel bearing plates 11 to provide a rigid bearing surface for the system.

In either case, the track housing 23 are electrically connected (and by extension all the vertebrae parallelly configured therein) to the de-pole brush (+) 25 and the re-pole brush (−) 26 on opposing rails 50.

Each track housing 23 may provide a vent 28 where air flows in and out of the track housing 23 as it compresses during de-poling and expands during re-poling. The vent 28 may be adjacent to the chill beam 10.

Silver, palladium, and zinc may be used for the through-housing insert 5 and bus bar 7 and insert into the graphite conductor in the center of the assembly if a three-metal thermal electric couple wiring scheme is employed with copper wiring and a copper insert from the carbon chill beam 10 through the exterior of the track housing 23. The copper wiring connects to the de-pole under carriage carbon brushes 25.

Electricity returning from the rail cars travels through copper wiring to the re-pole undercarriage carbon brush 26 on one side and zinc wiring leading back to the steel track housing. In a two-metal thermal electric wiring system, nickel may be used for the through-housing insert 5 and bus bar 7 connecting to a copper slab is used as a substitute for the graphite.

The connectors 4 may be sintered onto the top and bottom of the piezo slab 1 in the three-wire configuration. In the two-wire configuration the nickel connectors can be sintered to copper connectors or attached to the top of the piezo slab using copper infused epoxy. Using graphene in the configuration the piezo connectors 4 may be made of copper, nickel, or the like, thereby avoiding galvanic action via the rubber gasket.

The carbon brushes are not required if the electricity is sent to overhead wires or delivered to community structures along the track. Carbon brushes are part of the piezoelectric circuit as a third "metal" connecting the zinc and copper wiring so that cooling occurs inside the steel track housing and heating occurs in the nickel wiring outside along the track. The exception to this is changed a bit when using the nickel connectors over the copper connectors or copper infused epoxy to generate cooling inside of the vertebrae. Cooling can be enhanced using copper conductors 9 over the graphene.

As the wheels on the bogie approach the epoxy coated steel track housing 23, the elastomeric rail bearing pad(s) 12 above the exiting precast concrete tie 19 begin to compress, transferring force to the epoxy coated housing cover 24. As the rail deflects the position of the steel rail plate 13 gently lowers, providing for the smooth delivery of compressive force to the epoxy coated steel housing cover 24 and to the piezo slabs 1 below. The curved shape of the upper compressions disc 32 accommodates the slight rotation of the epoxy coated steel housing cover 24 as the rail deflects.

When installing over existing ties, the wiring is simply placed on or under the gravel between the ties. Since the new precast concrete ties are installed over the gravel base, the wiring need to get to both the positive and negative brushes. Holes, grommets, wiring are shown in the steel bearing plate to permit the wiring to and from the for the wiring conduits are shown on FIG. 4B. They are carefully coordinated with the cores 19 in the precast so that the wires can be installed and serviced and so that the Nelson bolts end up in the solid portion of the precast to transfer the load of the cars through to the gravel below.

The elastomeric rail clamp(s) 14 dampen any horizontal movement and maintain the position of the rail with respect to the device. Working together the device harvests electricity from the weight of the rail cars rolling down the track and delivers it to the railcar or communities along the track. The electricity may deliver power to the cars through the carbon brushes to an under carriage pick up or sent through the conduits in the precast to overhead wires. This is considerably more expensive but does not require any updates or modifications to older light rail cars.

First and foremost, the energy harvesters deliver the load from the cars so that there is only a vertical load on the piezoelectric material. Using elastomeric rail pads with elastomeric rail clamps on either side of the harvesters absorbs any horizontal motion from the cars and smoothly transfers the load to the steel bearing plate 11. Housing the piezo media/slabs 1 inside steel 'vertebrae' limits the media from any lateral forces and protects it from exposure to moisture to allow the introduction of a venting system. Air exhausts the steel housing as the wheels overhead compresses the steel bearing plates 11. Hot air inside the housing is exhausted and cools, fresh air from the outside ventilates the housing. As the piezo media re-poles, the electrical charge is directed through the thermal electric pairs inside the housing. Additional cooling is supplied by carefully selected thermal electric pairs.

Battery powered electric light rail cars already exist and are suited for the technology with two distribution options for the electricity from the piezo system. The harvesting devices (track housing 23) can be wired to conduct the electricity to the overhead lines, sent directly into the motors in the bogies, or delivered to the batteries underneath the carriages. In either case motor controllers convert the dc power to ac to drive the motors efficiently. Electric wiring for supplying the overhead conductors needs to be clipped and isolated at each vertical support so that energy is not dissipated over the length of the supply wires. Direct current from the batteries is used to initiate travel but can be replaced with AC power at 60 Hz +/− when the trains reach 33 mph for light rail and 66 mph for freight rail. The harvesters/track housing 23 have been designed to produce 1.5 kW per wheel, for a total amperage of 12 kW per car. The typical freight train has 100 cars and typically requires 1.2 MW to operate at cruising speeds or 12kW per car. Understanding the over the long haul, additional energy may be required, the renewable energy from the harvesters can be supplemented by the batteries with the understanding that recharging is likely to occur at the energy of the trip. Since the freight and light rail cars can travel forty miles on their own, renewable energy from the energy harvesters can provide carbon neutral energy to communities along the tracks.

During the rail-based vehicle's initial start, motor controllers draw power from the batteries in the vehicle. Once travel speeds have been reached, the current simulates alternating current that can be fed directly into the motors or simply left to charge the battery. During the transition to carbon neutral power, before new freight cars become common, the renewable energy from the can be fed through the existing overhead lines.

Additive manufacturing now has the capacity to print in metals and piezo ceramics, and pole them, so that the energy harvesters can be manufactured in maker spaces or in local shops. In fact, additive manufacturing is much more efficient at producing the PVDF material than the traditional method of printing out sheets and stretching them. $KNbO_3$ that does not contain lead and has a much higher Curie temperature does not contain can also be printed. That does not preclude the use of lead containing materials, rather it is just safer for those manufacturing and assembling the harvesters. Steel housings and plates can be found form rail supply distributors who also supply the rail bearing pads, elastomeric chips, and fasteners/anchor bolts. Almost any precast concrete facility can fabricate the cross ties shown and delivered to the site.

The choice of thermal electric materials used in the energy harvesters is based on the interactions with existing infrastructure and the vertebrae can be made using additive manufacturing methods or simply stamped out in large quantities. The carbon and copper brushes can also be replaced with induction materials.

The present invention may be used as energy harvesters to provide carbon neutral, fossil fuel free energy for rail transit and logistics. The devices are either inserted under the rails between existing concrete ties, or prewired and positioned on top of new precast concrete ties.

Existing rails are raised before inserting the harvesters between the ties and existing rails on new precast ties are raised, temporarily located to the side of the rail bed, then repositioned after the assemble is secured. The device can be prewired on new precast concrete ties and the entire assembly can be lifted and transported to a new track location. The dimension between axles in the bogies and the dimension between the bogies are multiples of the distance between rail ties which is one half meter. Modifying the design of the bogies and the placement of them under the cars can create an electrical current that simulates alternating current to drive the motors. This opens the possibility to transit and logistic travel for autonomous cars in the future.

In addition to providing an alternative to short and medium range transportation using autonomous rail cars, the device has been proposed for use under fuel cells to harvest energy from the up and down motion of large container ships. In this case, additional energy is created by placing the thermal electric media in contact with the inside of the hull.

The device produces carbon neutral renewable energy for light, freight, and autonomous rail transit and logistics. The energy harvesters could be reconfigured and positioned between the axles and shock absorbers to serve as range extenders for automotive transit and logistics.

The present invention may provide contrasting coefficients of thermal resistance for electrical connections and wiring can cool the interior of the enclosure, inside the Vertebrae, or both, to keep the temperature from rising above the Curie temperature for the piezo electric material. Current flowing from resistive to transmitting materials cools and heats going the other way.

Electricity always flows along the path of least resistance and the more resistive component of a thermal electric pair acts as a "backflow preventer" to encourage the current to flow towards the less resistant component.

The heat generated during the compression of the piezo material generates a supplemental electrical current in the thermal electric pair. The molecules in a 3D printed Polyvinylidene Fluoride piezo pad can be poled by adding a cathode [+] after the printer head and using the platform of graphene film as an anode [-].

PVDF and KNN mixed with a plastic binder and printed using an additive manufacturing technique with a cathode [+] following the printer head and the printer base or graphene film as an Anode [-]. Sintering is required for the KNN the binder sublimates before the sintering temperature reaches 900F/482C. which is below the Curie temperature for KNN which is 932/500C.

Using a copper coated graphene connector for the input to the piezo electric material and a graphene conductor for the electricity exiting the vertebrae cools the piezo electric material inside the vertebrae.

Covering the copper coated graphene connector [above, 9] with an epoxy potting compound distributes the load axial load equally and prevents oxygen from causing any galvanic action between the two components.

Taking special car to insert a thimble of one material through an EPDM coating/washer and into the second material allows the wiring to connect in an Oxygen free environment. Galvanic activity only occurs in the presence of Oxygen.

Allowing air movement into and out of the housing provides additional cooling.

As used in this application, the term "about" and "approximately", and "substantially" refers to a range of values within plus or minus 10% of any specified number. Furthermore, the words "about" and "approximately," and the like, when accompanying a numerical value, are to be construed as indicating a deviation as would be appreciated by one of ordinary skill in the art to operate satisfactorily for an intended purpose. And the term "substantially" refers to between 90% and 110% of an entirety or an extent.

Recitation of ranges of values herein are not intended to be limiting, referring instead individually to any and all values falling within the range, unless otherwise indicated, and each separate value within such a range is incorporated into the specification as if it were individually recited herein. Furthermore, ranges of values and/or numeric values are provided herein as examples only, and do not constitute a limitation on the scope of the described embodiments.

The use of any and all examples, or exemplary language ("e.g.," "such as," or the like) provided herein, is intended merely to better illuminate the embodiments and does not pose a limitation on the scope of the embodiments or the claims. No language in the specification should be construed as indicating any unclaimed element as essential to the practice of the disclosed embodiments.

In the following description, it is understood that terms such as "first," "second," "top," "bottom," "up," "down," and the like, are words of convenience and are not to be construed as limiting terms unless specifically stated to the contrary.

It should be understood, of course, that the foregoing relates to exemplary embodiments of the invention and that modifications may be made without departing from the spirit and scope of the invention as set forth in the following claims.

What is claimed is:

1. A power generating system for a rail transport application, the power generating system comprising:
    a plurality of piezo vertebrae configured in parallel and housed in a track housing; and
    the track housing having a cover operatively associated with a rail of the rail transport application in such a way that, when a rail vehicle of the rail transport application rides the rail, said cover is urged against the plurality of piezo vertebrae,
    whereby electricity is generated.

2. The power generating system of claim 1, wherein the plurality of piezo vertebrae is arranged in at least two columns of stacks of piezo vertebrae; and an upper compression plate spanning at least two columns of stacks of piezo vertebrae.

3. The power generating system of claim 2, further comprising a chill beam disposed between adjacent columns the two columns of stacks of piezo vertebrae.

4. The power generating system of claim 1, wherein each piezo vertebra enables vertical movement from axial compression without compromising the integrity of an enclosure around the piezo electric material.

5. The power generating system of claim 1, wherein the rail transport application provides a positive brush and a negative brush, and wherein each brush is electrically connected to each piezo vertebra for de-poling and re-poling a piezoelectric mass therein.

6. The power generating system of claim 1, wherein each piezo vertebra enables vertical movement from axial compression without plastically compromising a vertical height of the piezo vertebra.

\* \* \* \* \*